(12) United States Patent
Pandhumsoporn et al.

(10) Patent No.: US 8,262,920 B2
(45) Date of Patent: Sep. 11, 2012

(54) MINIMIZATION OF MASK UNDERCUT ON DEEP SILICON ETCH

(75) Inventors: Tamarak Pandhumsoporn, Fremont, CA (US); Patrick Chung, Tracy, CA (US); Jackie Seto, Mountain View, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 819 days.

(21) Appl. No.: 11/820,334

(22) Filed: Jun. 18, 2007

(65) Prior Publication Data

US 2008/0308526 A1 Dec. 18, 2008

(51) Int. Cl.
C03C 15/00 (2006.01)

(52) U.S. Cl. .............. 216/37; 216/41; 216/46; 216/58; 216/67; 216/79

(58) Field of Classification Search .............. 216/67, 216/37, 41, 46, 58, 79; 438/696
See application file for complete search history.

(56) References Cited

U.S. PATENT DOCUMENTS

| | | | |
|---|---|---|---|
| 4,707,218 A | | 11/1987 | Giammarco et al. |
| 5,273,609 A | | 12/1993 | Moslehi |
| 5,866,483 A | * | 2/1999 | Shiau et al. ............ 438/720 |
| 5,895,740 A | | 4/1999 | Chien et al. |
| 6,046,116 A | * | 4/2000 | DeOrnellas et al. ...... 438/715 |
| 6,391,790 B1 | * | 5/2002 | Stoehr et al. ............ 438/715 |
| 6,511,912 B1 | * | 1/2003 | Chopra et al. ............ 438/674 |
| 6,706,586 B1 | * | 3/2004 | Collins et al. ............ 438/243 |
| 6,774,046 B2 | * | 8/2004 | DeOrnellas et al. ...... 438/714 |
| 7,250,371 B2 | | 7/2007 | Kang et al. |
| 2004/0077160 A1 | * | 4/2004 | Singh .................... 438/585 |
| 2004/0097077 A1 | * | 5/2004 | Nallan et al. ............ 438/689 |
| 2005/0048785 A1 | * | 3/2005 | Kang et al. ............. 438/696 |
| 2005/0211668 A1 | * | 9/2005 | Pandhumsoporn ........ 216/59 |
| 2006/0223324 A1 | * | 10/2006 | Ikegami .................. 438/700 |
| 2006/0266478 A1 | * | 11/2006 | Lee et al. ................ 156/345.24 |

FOREIGN PATENT DOCUMENTS

| | | |
|---|---|---|
| JP | 2001-015426 | 1/2001 |
| KR | 1020070047015 | 5/2007 |

OTHER PUBLICATIONS

International Search Report dated Sep. 29, 2008 from International Application No. PCT/US2008/065578.
Written Opinion dated Sep. 29, 2008 from International Application No. PCT/US2008/065578.

* cited by examiner

*Primary Examiner* — Nadine G Norton
*Assistant Examiner* — Christopher Remavege
(74) *Attorney, Agent, or Firm* — Beyer Law Group LLP

(57) ABSTRACT

A method for forming features in a silicon layer is provided. A mask is formed with a plurality of mask openings over the silicon layer. A polymer layer is deposited over the mask by flowing a hydrogen free deposition gas comprising $C_4F_8$, forming a plasma from the deposition gas, depositing a polymer from the plasma for at least 20 seconds, and stopping the depositing the polymer after the at least 20 seconds. The deposited polymer layer is opened by flowing an opening gas, forming a plasma from the opening gas which selectively removes the deposited polymer on bottoms of the plurality of mask openings with respect to deposited polymer on sides of the plurality of mask openings, and stopping the opening when at least some of the plurality of mask features are opened. The silicon layer is etched through the mask and deposited polymer layer.

15 Claims, 8 Drawing Sheets

MINIMIZATION OF MASK UNDERCUT ON DEEP SILICON ETCH

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. Deep ultra violet (DUV) photoresist is exposed by 248 nm light. To facilitate understanding, FIG. 1A is a schematic cross-sectional view of a photoresist mask 112 over a silicon etch layer 108. The photoresist mask 112 has mask openings 122. The silicon etch layer 108 may be over a substrate 104 with one or more layers disposed between, or the silicon etch layer may be the silicon substrate. FIG. 1B is a schematic cross-sectional view of the photoresist mask 112 and silicon etch layer 108, after features have been etched into the silicon etch layer 108. The etch process causes mask undercut 116, which causes the resulting silicon lines to be thinner than the original mask. It has been found that the deeper the etch, the more severe the undercut.

SUMMARY OF THE INVENTION

To achieve the foregoing and in accordance with the purpose of the present invention, a method for forming features in a silicon layer is provided. A mask is formed with a plurality of mask openings over the silicon layer. A polymer layer is deposited over the mask by flowing a hydrogen free deposition gas comprising $C_4F_8$, forming a plasma from the deposition gas, depositing a polymer from the plasma for at least 20 seconds, and stopping the depositing the polymer after the at least 20 seconds. The deposited polymer layer is opened by flowing an opening gas, forming a plasma from the opening gas which selectively removes the deposited polymer on bottoms of the plurality of mask openings with respect to deposited polymer on sides of the plurality of mask openings, and stopping the opening when at least some of the plurality of mask features are opened. The silicon layer is etched through the mask and deposited polymer layer.

In another manifestation of the invention a method for forming features in a silicon layer is provided. A mask is formed with a plurality of mask openings over the silicon layer. The silicon layer is placed in a plasma process chamber. A polymer layer is deposited over the mask by flowing a hydrogen free deposition gas consisting essentially of $C_4F_8$ into the plasma process chamber, forming a plasma from the deposition gas, depositing a polymer from the plasma for at least 20 seconds to form a layer at least 200 nm thick, and stopping the depositing the polymer after the at least 20 seconds. The deposited polymer layer is opened by flowing an opening gas into the plasma process chamber, forming a plasma from the opening gas which selectively removes the deposited polymer on bottoms of the plurality of mask openings with respect to deposited polymer on sides of the plurality of mask openings, and stopping the opening when at least some of the plurality of mask features are opened. The silicon layer is etched through the mask and deposited polymer layer by flowing an etching gas different from the opening gas and forming a plasma from the etching gas, which etches the silicon layer, wherein the deposited polymer layer prevents undercutting of the silicon layer under the photoresist mask. The silicon layer is removed from the plasma process chamber.

In another manifestation of the invention, an apparatus for etching features in a silicon layer under a mask with openings is provided. A plasma processing chamber is provided comprising chamber wall forming a plasma processing chamber enclosure, a substrate support for supporting a substrate within the plasma processing chamber enclosure, a pressure regulator for regulating the pressure in the plasma processing chamber enclosure, an upper electrode for providing power to the plasma processing chamber enclosure, a lower electrode for providing power, a first RF power source electrically connected to the upper electrode, a second RF power source electrically connected to the lower electrode, a gas inlet for providing gas into the plasma processing chamber enclosure, and a gas outlet for exhausting gas from the plasma processing chamber enclosure. A gas source is in fluid connection with the gas inlet and comprises a hydrogen free $C_4F_8$ deposition gas source, an opening gas source, and an etching gas source. A controller is controllably connected to the gas source, the first RF power source, and the second RF power source and comprises at least one processor and computer readable media. The computer readable media, comprises computer readable code for depositing a polymer layer over the mask, comprising computer readable code for flowing a hydrogen free deposition gas comprising $C_4F_8$ from the hydrogen free $C_4F_8$ deposition gas source into the plasma processing chamber, computer readable code for forming a plasma from the deposition gas, computer readable codes for depositing a polymer from the plasma for at least 20 seconds, and computer readable code for stopping the depositing the polymer after the at least 20 seconds, computer readable code for opening the deposited polymer layer, comprising computer readable code for flowing an opening gas from the opening gas source into the plasma processing chamber, computer readable code for forming a plasma from the opening gas which selectively removes the deposited polymer on bottoms of the plurality of mask openings with respect to deposited polymer on sides of the plurality of mask openings, and computer readable code for stopping the opening when at least some of the plurality of mask features are opened, and computer readable code for etching the silicon layer through the mask and deposited polymer layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
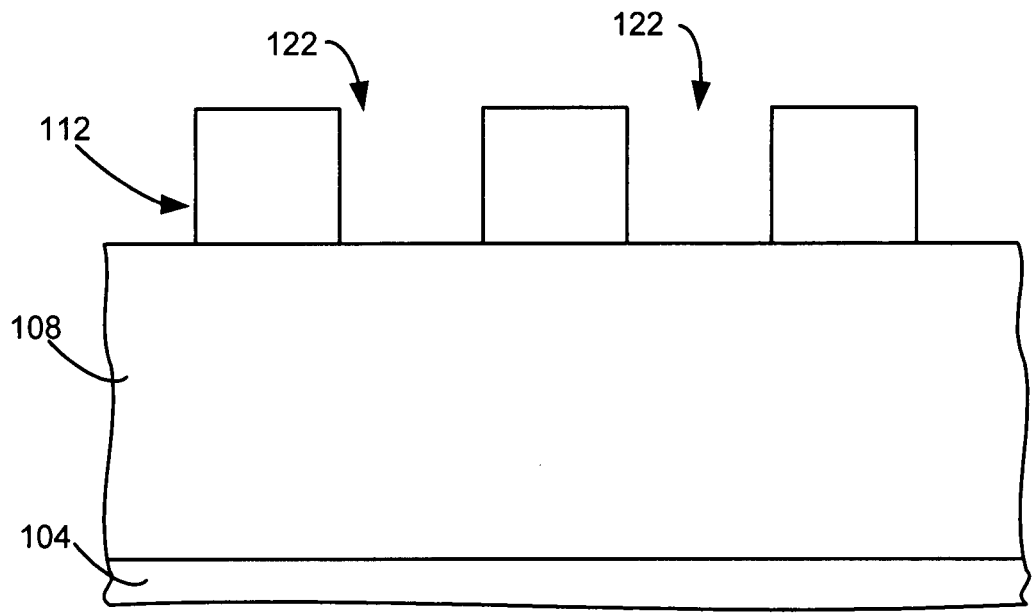
FIGS. 1A-B are schematic cross-sectional views of features formed according to the prior art.
Figure 1:
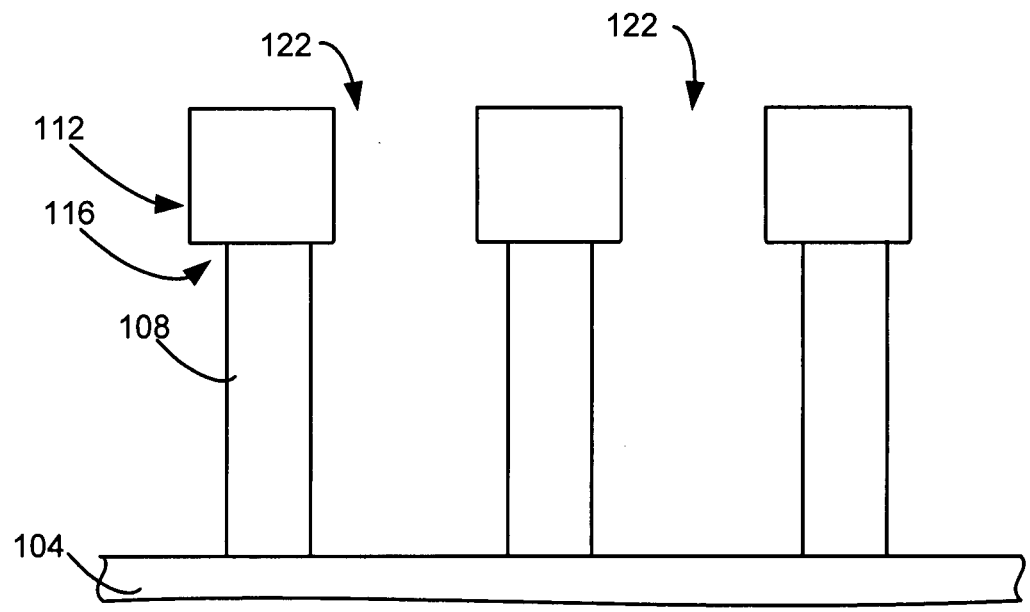
Figure 2:
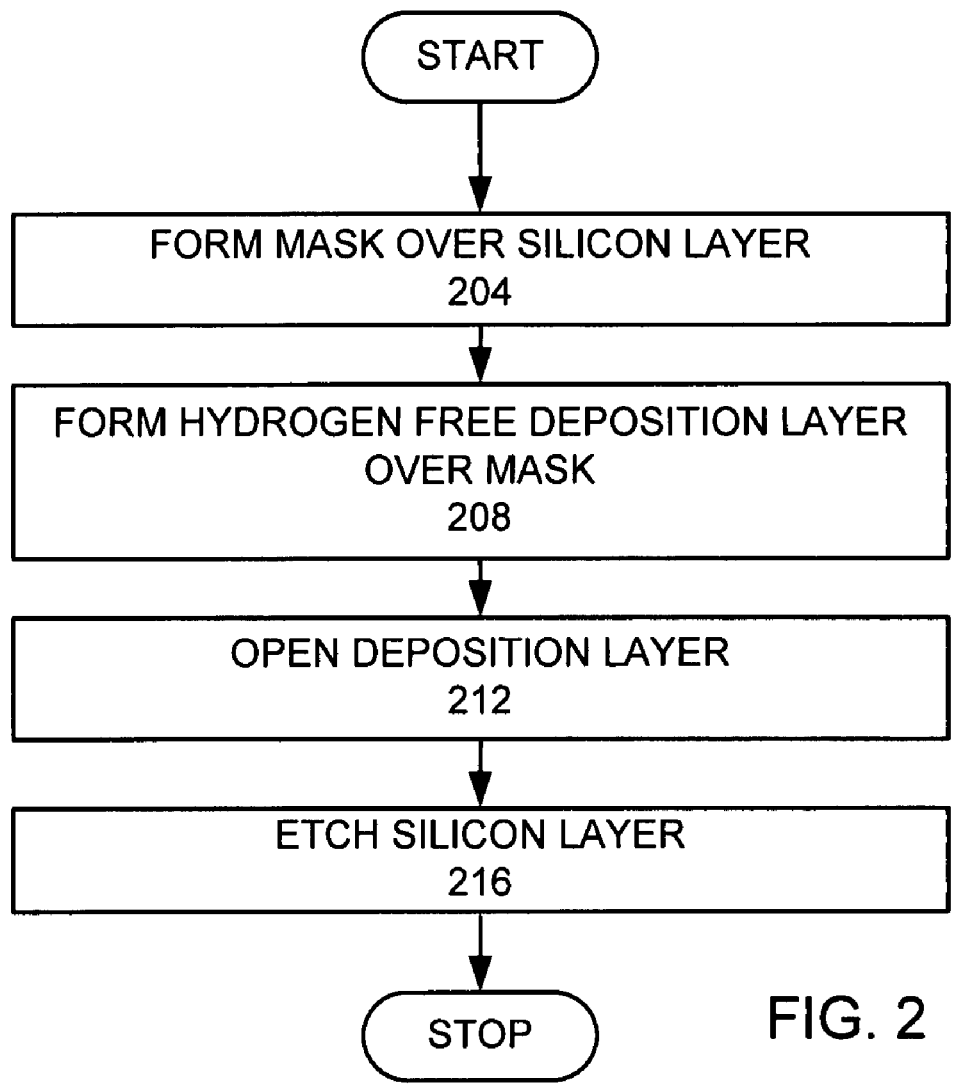
FIG. 2 is a high level flow chart of a process that may be used in an embodiment of the invention.

To facilitate understanding, FIG. 2 is a high level flow chart of a process that may be used in an embodiment of the invention. A mask is formed over a silicon layer to be etched (step 204). The silicon layer may be polysilicon, crystalline silicon, such as a silicon wafer, or amorphous silicon. The silicon layer is generally a pure silicon, which may have a dopant. The silicon layer is not silicon oxide or silicon nitride, although the silicon layer may have a thin silicon oxide layer that may naturally form over the top surface of the silicon layer. A polymer is deposited over the mask using a hydrogen free deposition gas (step 208). In such a hydrogen free deposition gas, none of the molecules making up the hydrogen free deposition gas have any hydrogen. The deposition layer is opened (step 212). The silicon layer is etched (step 216).

Example

Figure 3:
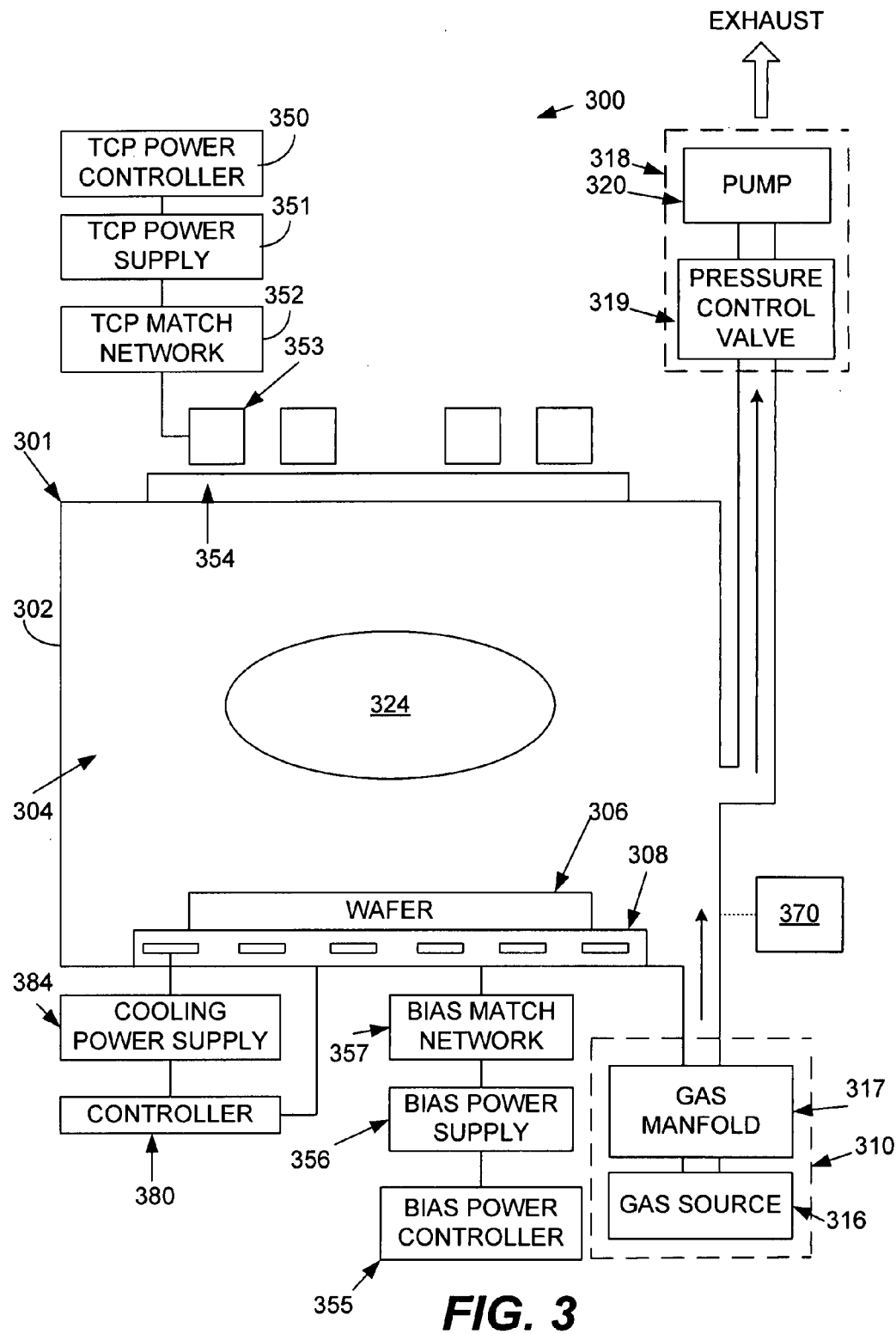
FIG. 3 is a schematic view of a plasma processing chamber that may be used in practicing the invention.

In an example of an implementation of the invention, FIG. 3 illustrates a processing tool that may be used in an implementation of the invention. FIG. 3 is a schematic view of a plasma processing system 300, including a plasma processing tool 301. The plasma processing tool 301 is an inductively coupled plasma etching tool and includes a plasma reactor 302 having a plasma processing chamber 304 therein. A transformer coupled power (TCP) controller 350 and a bias power controller 355, respectively, control a TCP power supply 351 and a bias power supply 356 influencing the plasma 324 created within plasma chamber 304.

The TCP power controller 350 sets a set point for TCP power supply 351 configured to supply a radio frequency signal at 13.56 MHz, tuned by a TCP match network 352, to a TCP coil 353 located near the plasma chamber 304. An RF transparent window 354 is provided to separate TCP coil 353 from plasma chamber 304 while allowing energy to pass from TCP coil 353 to plasma chamber 304.

The bias power controller 355 sets a set point for bias power supply 356 configured to supply an RF signal, tuned by bias match network 357, to a chuck electrode 308 located within the plasma chamber 304 creating a direct current (DC) bias above electrode 308 which is adapted to receive a substrate 306, such as a semi-conductor wafer work piece, being processed.

A gas supply mechanism or gas source 310 includes a source or sources of gas or gases 316 attached via a gas manifold 317 to supply the proper chemistry required for the process to the interior of the plasma chamber 304. A gas exhaust mechanism 318 includes a pressure control valve 319 and exhaust pump 320 and removes particles from within the plasma chamber 304 and maintains a particular pressure within plasma chamber 304.

A temperature controller 380 controls the temperature of a cooling recirculation system provided within the chuck electrode 308 by controlling a cooling power supply 384. The plasma processing system also includes electronic control circuitry 370. The plasma processing system may also have an end point detector.

Figure 4A:
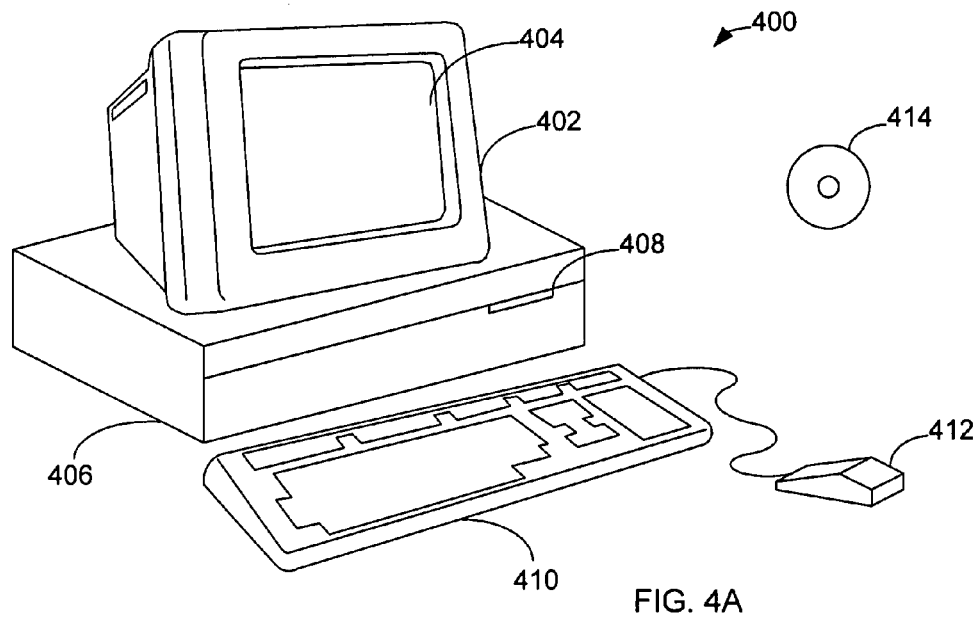
FIGS. 4A-B illustrate a computer system, which is suitable for implementing a controller used in embodiments of the present invention.
Figure 4B:
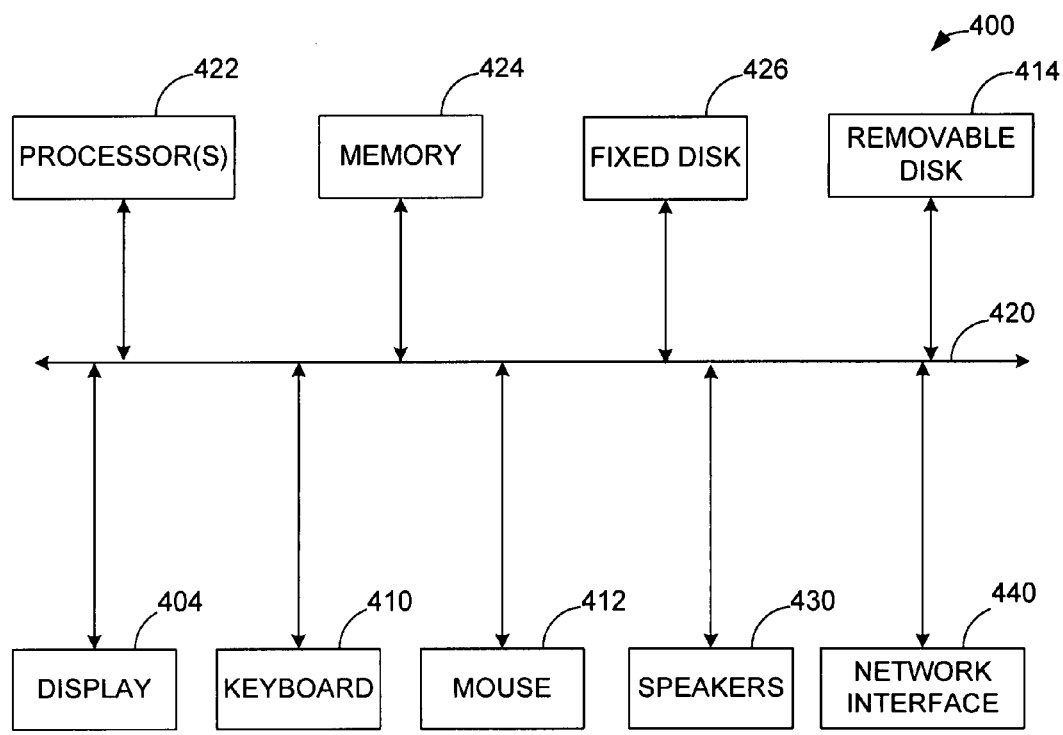

FIGS. 4A and 4B illustrate a computer system 400, which is suitable for implementing a controller for control circuitry 370 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 is also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 5A:
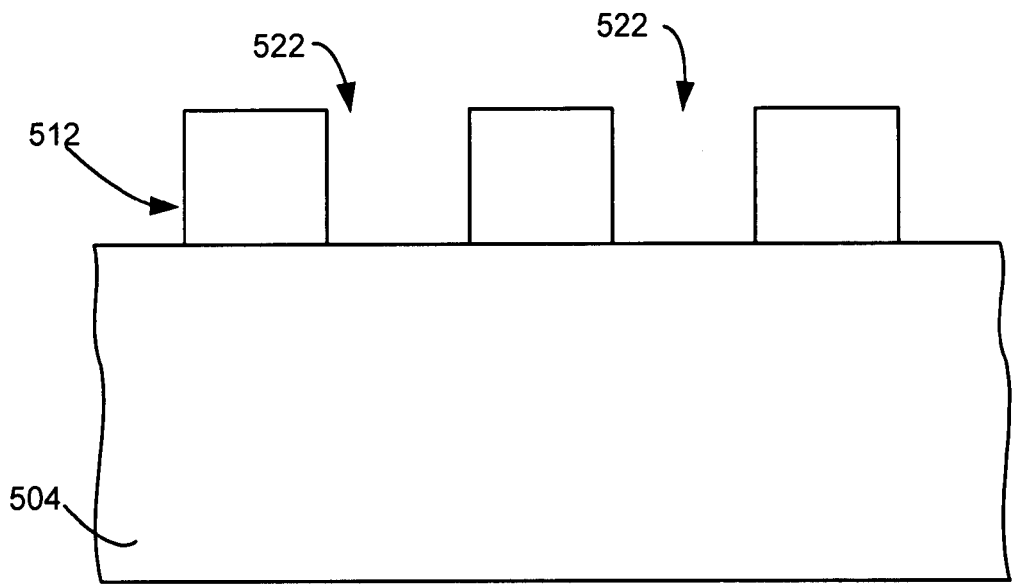
FIGS. 5A-D are schematic cross-sectional views of a stack processed according to an embodiment of the invention.

A mask is formed over a silicon layer (step 204). FIG. 5A is a schematic cross-sectional view of a silicon etch layer 504. In this example, the silicon etch layer is a crystalline silicon wafer, which forms a substrate. In this example, the mask 512 is a photoresist mask, which is deposited and then patterned to form openings 522 in the mask 512. In other examples, that mask may be of other materials, such as silicon oxide, which is used to form a hardmask. A photoresist mask may be used to form a hardmask. The wafer is placed in the plasma processing system 300.

Figure 5B:
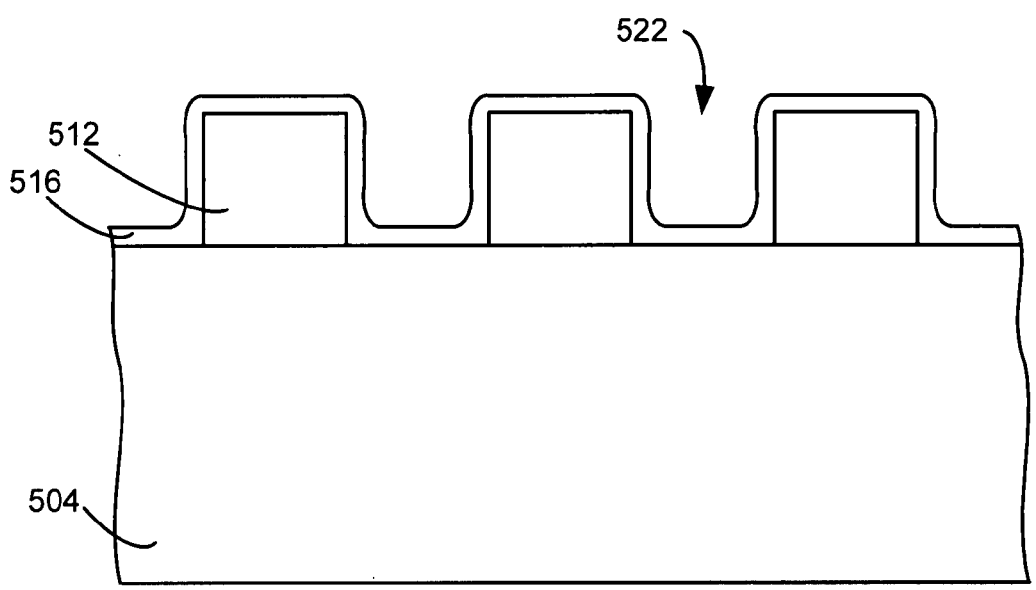
Figure 6:
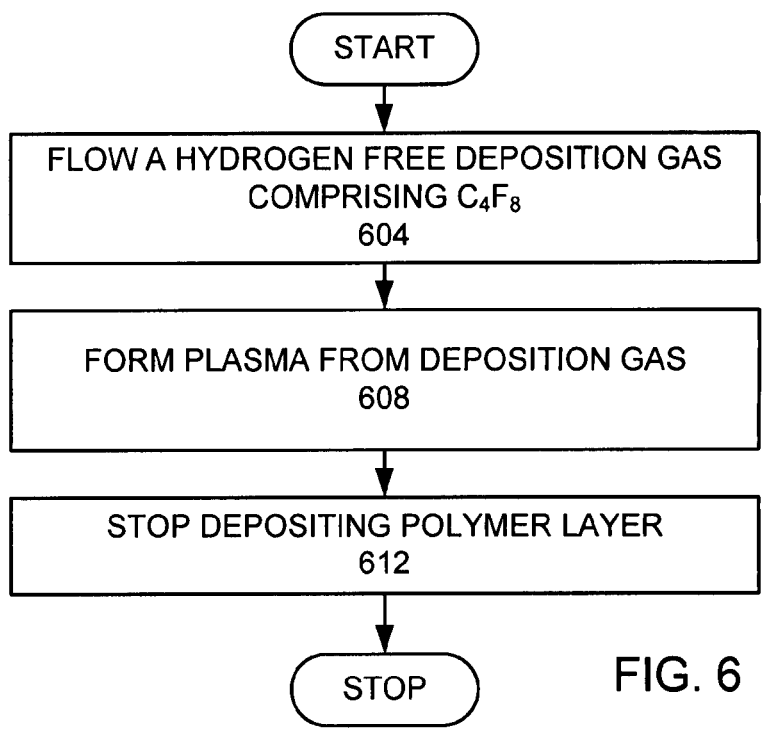
FIG. 6 is a more detailed flow chart of the hydrogen free deposition.

A hydrogen free deposition layer is formed over the mask (step 208). FIG. 5B is a view after the deposition layer 516 has been formed over the mask 512. FIG. 6 is a more detailed flow chart of the formation of the hydrogen free deposition layer. A hydrogen free deposition gas comprising $C_4F_8$ is flowed from the gas source 316 into the plasma processing tool 301 (step 604). In an example recipe, the deposition gas consists of pure $C_4F_8$. In this example, the deposition gas is 100 sccm $C_4F_8$. The deposition gas is transformed to a deposition plasma (step 608). In this example 900 watts at 13.56 MHz of power is provided to the top electrode and −65 volts at 400 KHz is provided to the bottom electrode to transform the deposition gas to a plasma. The deposition is provided for about 30 seconds. Then the depositing the polymer layer is stopped (step 612). A pressure of 90 mtorr is maintained.

Preferably the deposition is provided for at least 20 seconds. More preferably, the deposition is provided for at least 25 seconds. Most preferably, the deposition is provided for at least 30 seconds. Preferably, the deposition layer is at least 200 nm thick on the sidewalls. More preferably, the deposition layer is at least 300 nm thick on the sidewalls.

The deposition gas is a hydrogen free deposition to provide a deposition layer with improved properties over depositions that are not hydrogen free. In this example, the deposition gas is pure $C_4F_8$ because the resulting deposition layer provides improved properties.

Figure 5C:
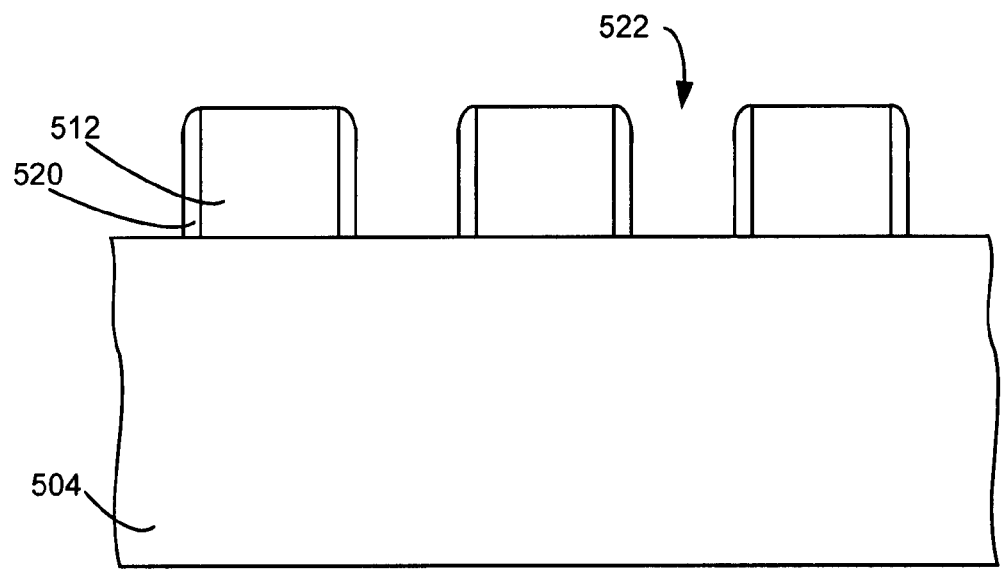
Figure 7:
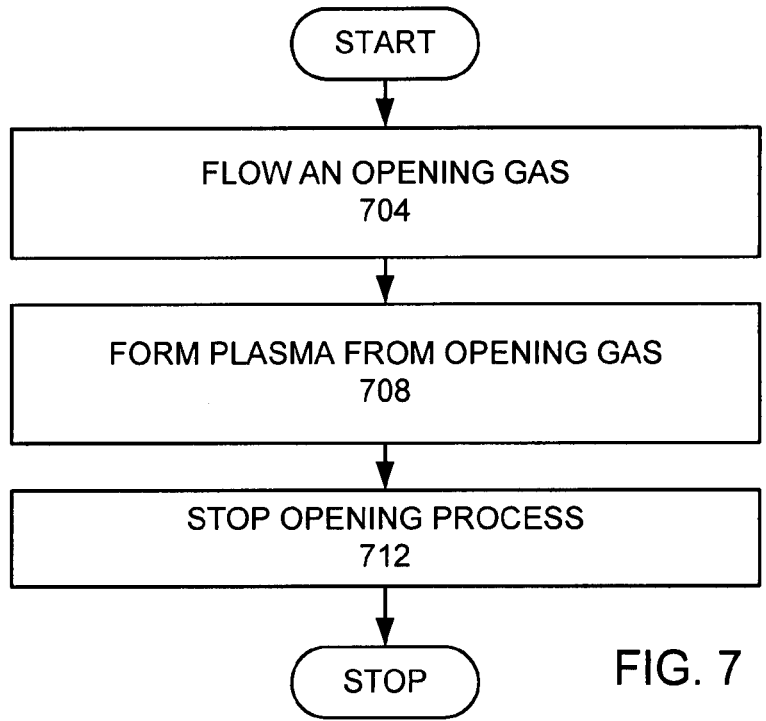
FIG. 7 is a more detailed flow chart of the opening of the deposition layer.

The deposition layer is opened (step 212). FIG. 5C is a view after the deposition layer is opened. In this example, the opening process removes the parts of the deposition layer on horizontal surfaces, leaving only sidewalls 520 formed by the deposition layer. FIG. 7 is a more detailed flow chart of the opening of the deposition layer. An opening gas is flowed from the gas source 316 into the plasma processing tool 301 (step 704). In this example, the opening gas is 30 sccm of $SF_6$. The opening gas is transformed to a opening plasma (step 708). In this example 600 watts at 13.56 MHz of power is provided to the top electrode and −150 volts at 400 KHz is provided to the bottom electrode to transform the opening gas to a plasma. The opening is provided for about 15 seconds. The opening process is then stopped (step 712). The pressure is set for 30 mtorr.

Other opening gases may comprise $CF_4$ and Ar, or $O_2$ and Ar, or $SF_6$ and Ar.

Figure 5D:
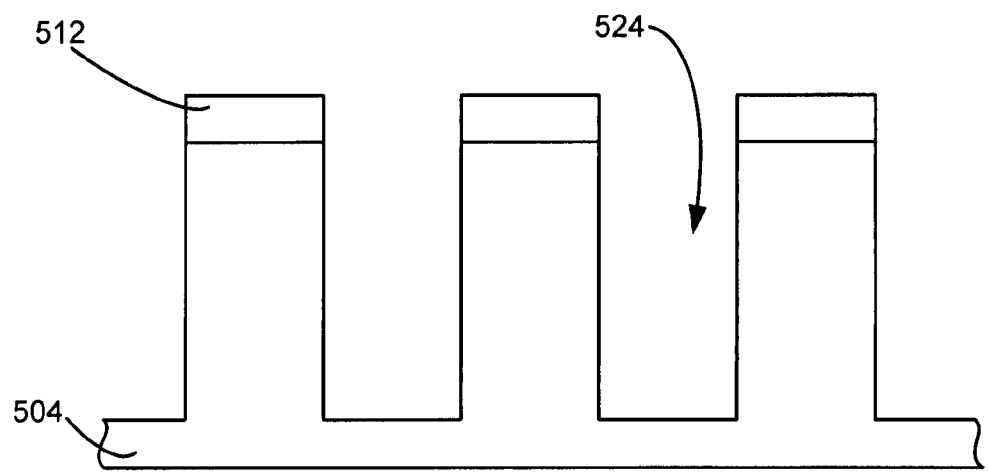

The silicon layer is etched (step 216). FIG. 5D is a view after the silicon etch has been performed. Features 524 have been etched into the silicon layer 504. In this example, the deposition layer has been completely etched away. In other examples, some of the deposition layer may remain. Also in this example, some of the photoresist mask 512 remains. In other examples, the photoresist mask may be completely etched away. If not completely removed, the deposited layer and mask are subsequently removed. It has been unexpectedly found that this example reduces or more preferably eliminates undercutting, as shown.

Figure 8:
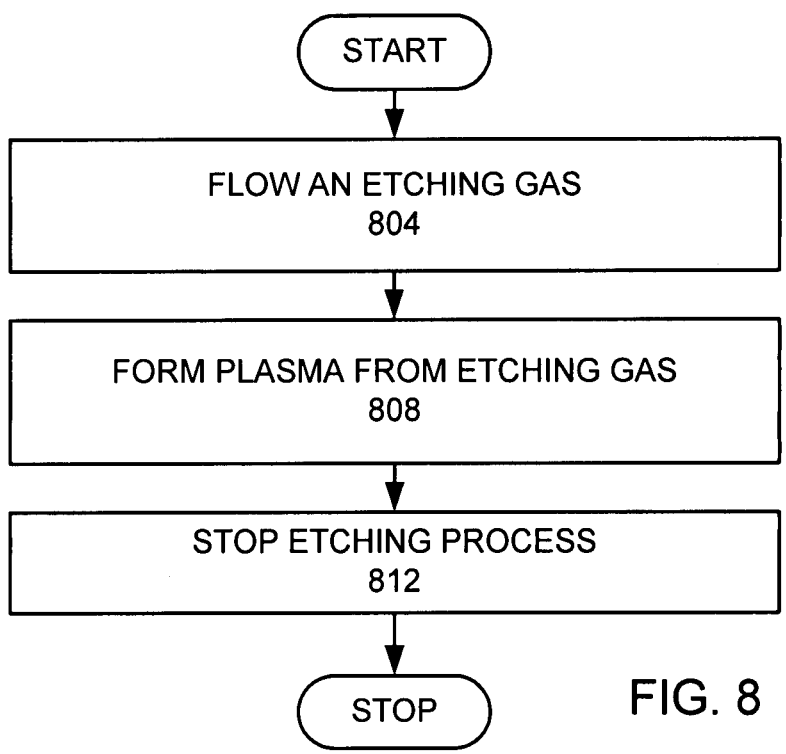
FIG. 8 is a more detailed flow chart of the etching of the silicon layer.

FIG. 8 is a more detailed flow chart of an example of the etching process. An etch gas is flowed from the gas source 316 into the plasma processing tool 301 (step 804). In this example, the etch gas is 200 sccm of $CF_4$. The etch gas is transformed to an etching plasma (step 808). In this example, 600 watts at 13.56 MHz of power is provided to the top electrode and −200 volts at 400 KHz is provided to the bottom electrode to transform the etch gas to a plasma. The etching is provided for about 20 seconds. The etching process is then stopped (step 812).

In other examples, a combination of short etching and deposition steps may be used. Such short deposition steps would deposit for less than 10 seconds. It is believed that multiple etch and deposition processes, especially with depositions greater than 10 seconds cause a stepped profile, instead of a vertical profile.

Although the etch gas chemistry may be the same as the opening gas chemistry in some examples, the plasma from the etching gas is different from the plasma from the opening gas, due to one or more differences in parameters. More preferably, the etching gas chemistry is different than the opening gas chemistry, since the etching gas chemistry is used for etching silicon, whereas the opening gas chemistry is used for opening the polymer deposition layer.

Preferably, the silicon features have a depth of at least 500 nm. More preferably, the silicon features have a depth of at least 1000 nm. Preferably, the silicon features have a depth to width aspect ratio of at least 5:1. More preferably, the silicon features have an aspect ratio of at least 10:1.

It has been found that the presence of hydrogen during the deposition causes an undesirable type of polymer to deposit.

In addition to eliminating undercutting, it has been unexpectedly found that this process provides improved control of the etch profile and allows quicker processing.

The invention also allows the formation of the deposition layer, opening of the deposition layer, and etching the silicon do be done in situ in a single plasma processing chamber.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming features in a silicon layer, comprising:
   forming a mask with a plurality of mask openings over the silicon layer;
   depositing a polymer layer over the mask, comprising:
      flowing a hydrogen free deposition gas comprising $C_4F_8$, wherein the deposition gas consists essentially of $C_4F_8$;
      forming a plasma from the deposition gas;
      depositing a polymer from the plasma for at least 20 seconds; and
      stopping the depositing the polymer after the at least 20 seconds;
   opening the deposited polymer layer, comprising:
      flowing an opening gas;
      forming a plasma from the opening gas which selectively removes the deposited polymer on bottoms of the plurality of mask openings with respect to deposited polymer on sides of the plurality of mask openings; and
      stopping the opening when at least some of the plurality of mask features are opened; and
   etching the silicon layer through the mask and deposited polymer layer, wherein the deposited polymer layer is completely etched away by etching the silicon layer.

2. The method, as recited in claim 1, wherein the etching the silicon layer comprises:
   flowing an etching gas; and
   forming a plasma from the etching gas, which etches the silicon layer.

3. The method, as recited in claim 2, wherein the opening gas is different from the etching gas.

4. The method, as recited in claim 3, wherein the depositing the polymer, opening the deposited polymer, and etching the silicon layer are done in situ in a single plasma processing chamber.

5. The method, as recited in claim 4, wherein the mask is a photoresist mask.

6. The method, as recited in claim 5, wherein the deposited polymer layer is at least 200 nm thick on the sides of the plurality of mask openings.

7. The method, as recited in claim 6, wherein the at least 200 nm thick deposited polymer on the sides of the plurality of mask openings eliminates undercutting.

8. The method, as recited in claim 1, wherein the depositing the polymer, opening the deposited polymer, and etching the silicon layer are done in situ in a single plasma processing chamber.

9. The method, as recited in claim 1, wherein the mask is a photoresist mask.

10. The method, as recited in claim 1, wherein the deposited polymer layer is at least 200 nm thick on the sides of the plurality of mask openings.

11. The method, as recited in claim 10, wherein the at least 200 nm thick deposited polymer on the sides of the plurality of mask openings eliminates undercutting.

12. A method for forming features in a silicon layer, comprising:
   forming a mask with a plurality of mask openings over the silicon layer;
   placing the silicon layer in a plasma process chamber;
   depositing a polymer layer over the mask, comprising:
      flowing a hydrogen free deposition gas consisting essentially of $C_4F_8$ into the plasma process chamber;
      forming a plasma from the deposition gas;
      depositing a polymer from the plasma for at least 20 seconds to form a layer at least 200 nm thick; and
      stopping the depositing the polymer after the at least 20 seconds;
   opening the deposited polymer layer, comprising:
      flowing an opening gas into the plasma process chamber;
      forming a plasma from the opening gas which selectively removes the deposited polymer on bottoms of the plurality of mask openings with respect to deposited polymer on sides of the plurality of mask openings; and
      stopping the opening when at least some of the plurality of mask features is opened;
   etching the silicon layer through the mask and deposited polymer layer, comprising:
      flowing an etching gas different from the opening gas; and
      forming a plasma from the etching gas, which etches the silicon layer, wherein the deposited polymer layer prevents undercutting of the silicon layer under the photoresist mask, and the deposited polymer layer is completely etched away by etching the silicon layer; and
   removing the silicon layer from the plasma process chamber.

13. The method, as recited in claim 12, wherein the mask is a photoresist mask.

14. The method, as recited in claim 13, further comprising removing the photoresist mask and deposited polymer layer in the plasma process chamber.

15. The method, as recited in claim 1, wherein the deposited polymer layer on the sides of the plurality of mask openings eliminates undercutting.

* * * * *